(12) United States Patent
Sawamura et al.

(10) Patent No.: US 6,627,582 B2
(45) Date of Patent: Sep. 30, 2003

(54) LARGE SUPERCONDUCTOR AND ITS INTERMEDIATE, AND METHOD FOR MANUFACTURING THE SAME

(75) Inventors: Mitsuru Sawamura, Futtsu (JP); Mitsuru Morita, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 80 days.

(21) Appl. No.: 09/801,448

(22) Filed: Mar. 8, 2001

(65) Prior Publication Data

US 2001/0053748 A1 Dec. 20, 2001

(30) Foreign Application Priority Data

Mar. 10, 2000 (JP) ........................................ 2000-067270
Oct. 4, 2000 (JP) ........................................ 2000-305102

(51) Int. Cl.[7] .......................... H01B 12/00; H01F 6/00; H01L 39/00
(52) U.S. Cl. ...................... 505/510; 505/234; 505/238; 505/451
(58) Field of Search ............................... 505/125, 126, 505/234, 510, 451, 490, 739, 729, 781, 785, 238; 428/54, 212, 688, 701; 117/930, 78, 944; 252/518.1, 521.1

(56) References Cited

U.S. PATENT DOCUMENTS

| | | | | |
|---|---|---|---|---|
| 5,084,436 A | * | 1/1992 | Morimoto et al. | 501/123 |
| 5,571,776 A | * | 11/1996 | Morita | 117/78 |
| 5,707,441 A | * | 1/1998 | Namikawa et al. | 117/14 |
| 5,851,956 A | * | 12/1998 | Namikawa et al. | 117/13 |
| 5,863,326 A | * | 1/1999 | Nause et al. | 117/217 |
| 6,103,670 A | * | 8/2000 | Kohayashi et al. | 505/451 |
| 6,256,521 B1 | * | 7/2001 | Lee et al. | 505/230 |

FOREIGN PATENT DOCUMENTS

| | | | | |
|---|---|---|---|---|
| JP | 05-170598 | | 7/1993 | |
| JP | 06316496 A | * | 11/1994 | C20B/29/22 |

* cited by examiner

Primary Examiner—Tom Dunn
Assistant Examiner—Colleen P. Cooke
(74) Attorney, Agent, or Firm—Kenyon & Kenyon (57) ABSTRACT

A large superconductor intermediate of $REBa_2Cu_3O_x$ system (where RE is one kind or a combination of rare earth elements including Y), characterized by a structure that oxide superconductors having non-superconductive phases finely dispersed in $REBa_2Cu_3O_x$ phases (123 phases) of different peritectic temperatures (Tp) are laminated three-dimensionally in the order of Tp's, seed crystals mounted on the oxide superconductor layer having a highest Tp, and excluded phases included in at least the oxide superconductor having the high Tp.

12 Claims, 12 Drawing Sheets

DIRECTION OF MEASURING TRAPPED MAGNETIC FLUX DENSITY

POSITION OF MEASURING TRAPPED MAGNETIC FLUX DENSITY

SEED CRYSTAL

OXIDE SUPERCONDUCTOR HAVING LOW $T_p$

OXIDE SUPERCONDUCTOR HAVING HIGH $T_p$

(b)

Ba-Cu-O PHASE, Cu-O PHASE, ETC.

(c)

Ba-Cu-O PHASE, Cu-O PHASE, ETC.

(a)
INTERNAL DIAMETER:EXTERNAL DIAMETER=1:2

POWDER 1-A
(10mm × 10mm SQUARE, 5mm THICKNESS)

(b)

POWDER 1-A (10mm × 10mm SQUARE, 5mm THICKNESS)
POWDER 4-A
POWDER 1-B
THICKNESS OF POWDER 4-A : THICKNESS OF POWDER 1-B = 1:5

(c)

SEED CRYSTAL
c AXIS
a(b) AXIS
a(b) AXIS

POWDER 1-A (10mm × 10mm SQUARE, 5mm THICKNESS)

POWDER 4-A

POWDER 1-B

THICKNESS OF POWDER 4-A : THICKNESS OF POWDER 1-B = 1:5

(b)

c AXIS
a(b) AXIS
a(b) AXIS

INTERNAL DIAMETER : EXTERNAL DIAMETER = 17:20

LARGE SUPERCONDUCTOR AND ITS INTERMEDIATE, AND METHOD FOR MANUFACTURING THE SAME

BACKGROUND OF THE INVENTION

1. Field of the Invention

The present invention relates to a large bulk material of a rare-earth-element oxide superconductor and a method for manufacturing the same.

2. Description of the Related Art

As a conventional method of manufacturing a superconductive bulk material of $REBa_2Cu_3O_x$ system with which the present invention is concerned, there has been a melting method as represented by the Quench and Melt Growth method (Patent Registration No. 1869884 and Patent Registration No. 2556401). This method is as follows: first, materials are heated up to a temperature of the region where $RE_2BaCuO_5$ phase or $RE_4Ba_2Cu_2O_{10}$ phase and a liquid phase including Ba—Cu—O compounds as a main component coexist, then, the materials are cooled to a level immediately above a peritectic temperature at which the $REBa_2Cu_3O_x$ phase generates, the material are further cooled slowly to generate crystals, and nucleus generation and crystal orientation in the material are controlled by the cooling to obtain a large bulk. Based on this manufacturing method, it is possible to obtain a relatively large superconductor having a high transition current density (a current density per unit cross section as one of superconductive characteristics).

Further, as a method for manufacturing a much larger superconductive bulk material, there has been known a method for using one seed crystal and sequentially combining materials having different starting-temperatures of crystal-growth together, and controlling a nucleus formation, a crystal orientation and a crystal growth direction (conventional method 1) (Japanese Patent Application Laid-open Publication No. 5-170598). According to this method, it is possible to manufacture a material having a diameter exceeding 100 mm. This method, however, has a problem in that it takes a long time for a crystal growth, one month as a maximum, and has low productivity.

Figure 1:
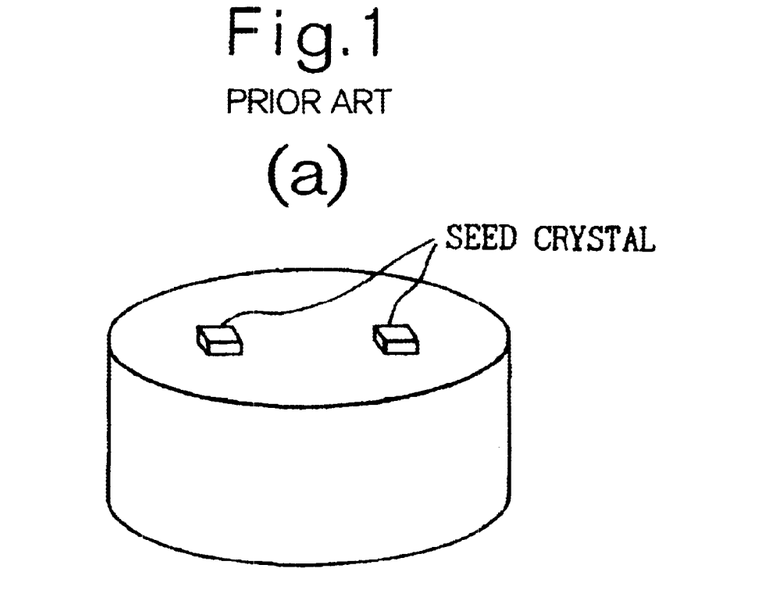
FIG. 1 is a diagram showing an example of a conventional method 2 that uses two seed crystals. (a) is a perspective view and (b) is a cross-sectional view.
Figure 2:
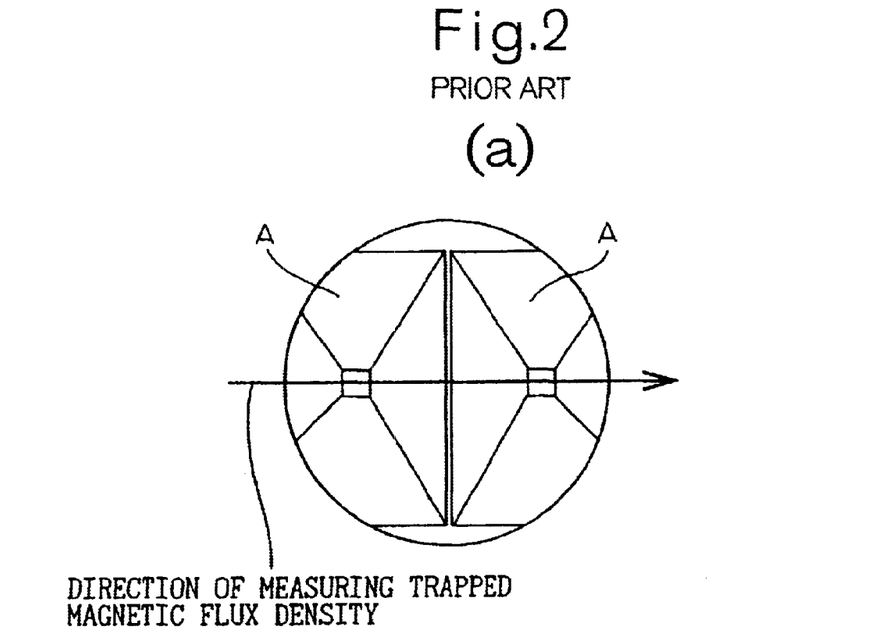
FIG. 2 is a diagram showing a trapped magnetic flux density distribution of an oxide superconductor manufactured by the conventional method 2 that uses two seed crystals. (a) is a diagram showing a measuring direction of the oxide superconductor; and (b) is a diagram showing a distribution of the trapped magnetic flux density in the measuring direction.

In the mean time, there has also been known a method for manufacturing a large material by growing a crystal from various seed crystals (conventional method 2). According to this method, a region for growing a crystal from each seed crystal becomes small, and therefore, this method has an advantage that it is possible to achieve a crystal growth in a relatively short time. Further, according to this method, a transition current density is high within a region (A) in which a crystal has grown from each seed crystal. However, as shown in FIG. 1 and FIG. 2, mainly a Ba—Cu—O compound and a Cu—O compound, or a segregated $RE_2BaCuO_5$ phase or $RE_4Ba_2Cu_2O_{10}$ phase are precipitated as excluded phases between the regions (A). As a result, the transition current density between these regions is lowered extremely. Therefore, this method has had a problem in that the characteristics of a superconductive bulk material manufactured by this method are extremely inferior to those of a material manufactured by the conventional method 1, as a total superconductive bulk unit. As a method of improving this situation, it has been reported that the distributing the seed crystals with smaller intervals (about 5 mm) between them will make it difficult to generate impurity phases. According to this improvement method, the whole surface for a crystal growth must be embedded with the seed crystals. Thus, this method has not been practical from the viewpoint of productivity. Therefore, there has been demanded a superconductive bulk unit and a method for manufacturing this superconductive bulk unit that makes it difficult to generate, or that does not generate, an excluded phase between the regions (A).

SUMMARY OF THE INVENTION

It is, therefore, an object of the present invention to provide a large superconductive bulk material and a method for manufacturing this large superconductive bulk material capable of reducing or eliminating excluded phases such as a Ba—Cu—O compound and a Cu—O compound, or a segregated $RE_2BaCuO_5$ phase or $RE_4Ba_2Cu_2O_{10}$ phase that are precipitated between one region of crystal growth from one seed crystal and the other region of crystal growth from the other seed crystal, and capable of making a larger current to flow between the regions of crystal growth from the seed crystals.

The present invention solves the above problems. An oxide superconductor is structured by oxide superconductors of 123 phases of two or more kinds of different peritectic temperatures (Tp). Seed crystals are disposed at the oxide superconductor side having a highest Tp, and crystals are grown. Then, it has been found that excluded phases of a Ba—Cu—O compound and a Cu—O compound, or a segregated $RE_2BacuO_5$ phase or $RE_4Ba_2Cu_2O_{10}$ phase are generated in the layers of superconductors having a high Tp, and that these excluded phases do not propagate easily in the superconductor layers having a low Tp. Based on this finding, the present invention provides a superconductive bulk unit that has reduced or eliminated "excluded phases" that interrupt a current flow in the superconductive bulk unit, at the portion of the superconductive layers having lower Tp's. As a result, the superconductive bulk unit can make a larger current to flow based on the use of the superconductor layers having a low Tp.

According to a first gist of the present invention, there is provided a large superconductor intermediate of $REBa_2Cu_3O_x$ system (where RE is one kind or a combination of rare earth elements including Y), characterized by a structure that oxide superconductors having non-superconductive phases finely dispersed in $REBa_2Cu_3O_x$ phases (123 phases) of different peritectic temperatures (Tp) are laminated three-dimensionally in the order of Tp's, seed crystals mounted on the oxide superconductor layer having a highest Tp, and excluded phases included in at least the oxide superconductor having the high Tp.

In the present invention, the $REBa_2Cu_3O_x$ system (where RE is one kind or a combination of rare earth elements including Y) means that a base phase is not only $REBa_2Cu_3O_x$, but also is $(RE_{1-z}Ba_z)_{1+y}Ba_{2-y}Cu_3O_x$ ($-0.5 \leq y \leq 1.0$, $0 \leq z \leq 0.5$). Further, this also includes a material of which a part of or the whole Ba has been substituted by Sr. Similarly, the $REBa_2Cu_3O_x$ (123) phases as the base phases include not only $REBa_2Cu_3O_x$, but also $(RE_{1-z}Ba_z)_{1+y}Ba_{2-y}Cu_3O_x$ ($-0.5 \leq y \leq 1.0$, $0 \leq z \leq 0.5$). Further, they also include a material of which a part of or the whole Ba has been substituted by Sr.

The non-superconductive layer in the present invention means the $RE_2BaCuO_5$ phase or the $RE_4Ba_2Cu_2O_{10}$ phase finely distributed in the $REBa_2Cu_3O_x$ phases (123 phases) as the base phases. Further, the $REBa_2Cu_3O_x$ phases (123 phases) of different peritectic temperatures (Tp) means a oxide superconductor structured by composition powders of different Tp's having different peritectic temperatures (Tp)

of the 123 phases by changing the RE compositions or changing the addition volumes of the added elements like Ag. Further, the structure obtained by a three-dimensional lamination means a lamination in layers, or a concentric structure, or a combination of these.

According to a second gist of the present invention, there is provided a large superconductor intermediate of the above first gist, wherein a deviation of a crystal orientation between the nearest seed crystals is within 30 degrees in the mounting of seed crystals. The nearest seed crystals in the present invention means the seed crystals that are located at the nearest positions among various disposed seed crystals. Further, the deviation in the crystal orientation means a minimum rotational angle that is necessary for matching a crystal orientation of a certain seed crystal with a crystal orientation of the nearest seed crystal by rotating these seed crystals in space.

According to a third gist of the present invention, there is provided a large superconductor intermediate of the above first or second gist, wherein the laminated structure includes at least one oxide superconductor that includes at least one of Rh of 0.001 to 2.0 mass %, Pt of 0.05 to 5.0 mass %, and Ce of 0.05 to 10.0 mass %.

According to a fourth gist of the present invention, there is provided a large superconductor prepared by carrying out a removal of an oxide superconductor that includes seed crystals or excluded phases and/or an oxygen enrichment heat treatment, to a large superconductor intermediate in any one of the above first to third gist.

According to a fifth gist of the present invention, there is provided a method for manufacturing a large superconductor intermediate, comprising the steps of heating raw material molds including RE, Ba and Cu that constitute a superconductor of the $REBa_2Cu_3O_x$ system (where RE is one kind or a combination of rare earth elements including Y), heating the molds to a level equal to or above a peritectic temperature (Tp) of $REBa_2Cu_3O_x$ phases (123 phases) of the molds as a maximum temperature, and cooling the molds to manufacture an oxide superconductor intermediate having non-superconductive phases finely dispersed in the 123 phases, characterized by laminating three-dimensionally the raw material molds of 123 phases having different Tp's in the order of Tp's to form a raw material mold laminate, mounting seed crystals on the raw material mold having a highest Tp, and generating a crystal growth of the raw material mold laminate.

According to a sixth gist of the present invention, there is provided a method for manufacturing a large superconductor intermediate of the above fifth gist, wherein a deviation of a crystal orientation between the nearest seed crystals is within 30 degrees in the mounting of seed crystals.

According to a seventh gist of the present invention, there is provided a method for manufacturing a large superconductor intermediate of the above fifth or sixth gist, wherein the raw material mold laminate includes at least one raw material mold that includes at least one of Rh of 0.001 to 2.0 mass %, Pt of 0.05 to 5.0 mass %, and Ce of 0.05 to 10.0 mass %.

According to an eighth gist of the present invention, there is provided a method for manufacturing a large superconductor of the $REBa_2Cu_3O_x$ system (where RE is one kind or a combination of rare earth elements including Y), comprising the steps of carrying out a removal of an oxide superconductor that includes seed crystals or excluded phases from the large superconductor intermediate manufactured by the method in any of the above fifth to seventh gist, and/or carrying out an oxygen enrichment heat treatment to this intermediate.

DESCRIPTION OF THE PREFERRED EMBODIMENTS

The present invention provides a large oxide superconductive bulk unit and a method for manufacturing the same capable of realizing a crystal growth in a relatively short period of time, and capable of reducing or eliminating the precipitation of excluded phases such as a Ba—Cu—O compound and a Cu—O compound, or a segregated $RE_2BaCuO_5$ phase or $RE_4Ba_2Cu_2O_{10}$ phase that interrupts a current flow in the superconductive bulk unit, thereby to make it possible to pass a larger current. The present invention has a feature in that oxide superconductors having different Tp's are used for growing crystals from seed crystals. This point will be explained in detail below.

According to the conventional method 2 that uses seed crystals, crystals are grown from the seed crystals as shown in (a) of FIG. 1. As a result, a Ba—Cu—O phase and a Cu—O phase, or a segregated $RE_2BaCuO_5$ phase or $RE_4Ba_2Cu_2O_{10}$ phase are excluded on the surface of crystal growth. Finally, a bulk unit having the excluded phases deposited as shown in (b) of FIG. 1 is obtained. However, the existence of these excluded phases substantially reduces the current that flows through the superconductor. When the superconductor is cooled in the magnetic field at the boiling point (77 K) of liquid nitrogen, and the trapped magnetic flux density is measured after removing an external magnetic field, a distribution as shown in (b) of FIG. 2 is observed. It can be known from this distribution that the current flowing through the superconductor is interrupted as compared with the case where the superconductor is obtained by using a material having a crystal growth carried out using a single seed crystal.

Figure 3:
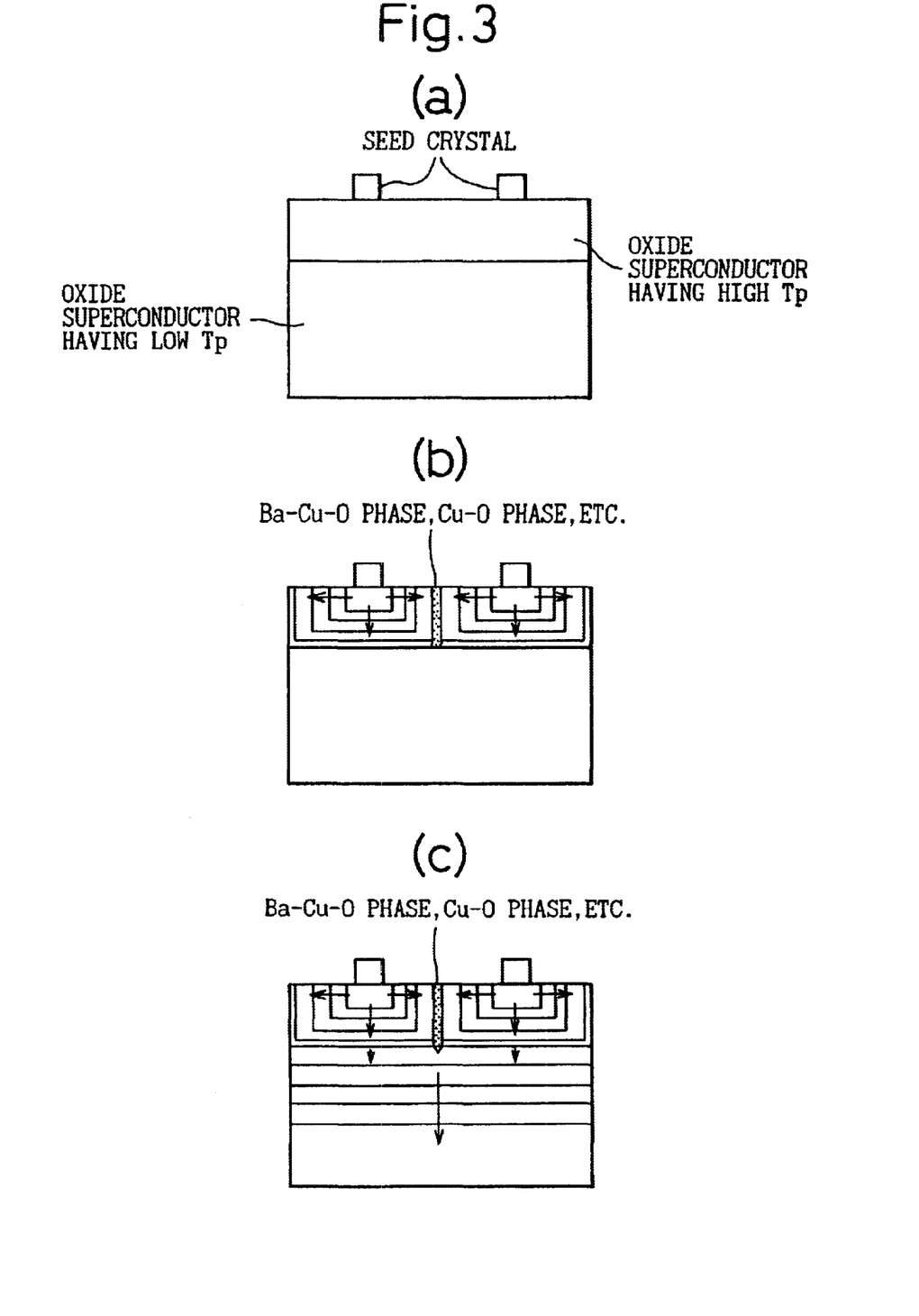
FIG. 3 is a diagram showing an example of the present invention that uses a plurality of seed crystals. (a) shows one example of a structure of the present invention. (b) is a schematic view showing a case where a temperature of crystal growth is lower than a peritectic temperature of "an oxide superconductor having a high Tp" and equal to or above a peritectic temperature of "an oxide superconductor having a low Tp". (c) is a schematic view showing a case where a temperature of crystal growth is lower than a peritectic temperature of "an oxide superconductor having a low Tp".

On the other hand, according to the method of the present invention, when materials having different Tp's are laid out as shown in (a) of FIG. 3, for example, directions of the crystal growth can be controlled, and the growth directions become like those shown in (b) and (c) of FIG. 3. Thus, while the crystal growth directions are partly opposite to each other according to the conventional method 2, these crystal growth directions can be changed by the present invention. The liquid phase (Ba—Cu—O phase or the Cu—O phase) that has been excluded on the surface of crystal growth is not excluded, or is difficult to be excluded, on the superconductive phase having a low Tp. As a result, there exist no excluded phases, or the existence of excluded phases become difficult. Thus, a large current can flow through the whole superconductor. The above is the reason for using the materials having different Tp's. According to the present invention, it is also possible to completely eliminate the existence of excluded phases by using three or more materials of different Tp's in combination.

Further, according to the present invention, it is possible to reduce or eliminate a Ba—Cu—O phase and a Cu—O phase, or a segregated $RE_2BaCuO_5$ phase or $RE_4Ba_2Cu_2O_{10}$ phase on the superconductor of a low Tp. However, these excluded phases are deposited on the superconductor having a high Tp Therefore, when the layer of the superconductor having a high Tp on which the excluded phases have been deposited is removed, it is possible to reduce or eliminate the excluded phases that interrupt the flow of a current through the superconductive bulk unit. As a result, it is possible to obtain a large superconductive bulk unit capable of allowing a large current to flow.

Figure 4:
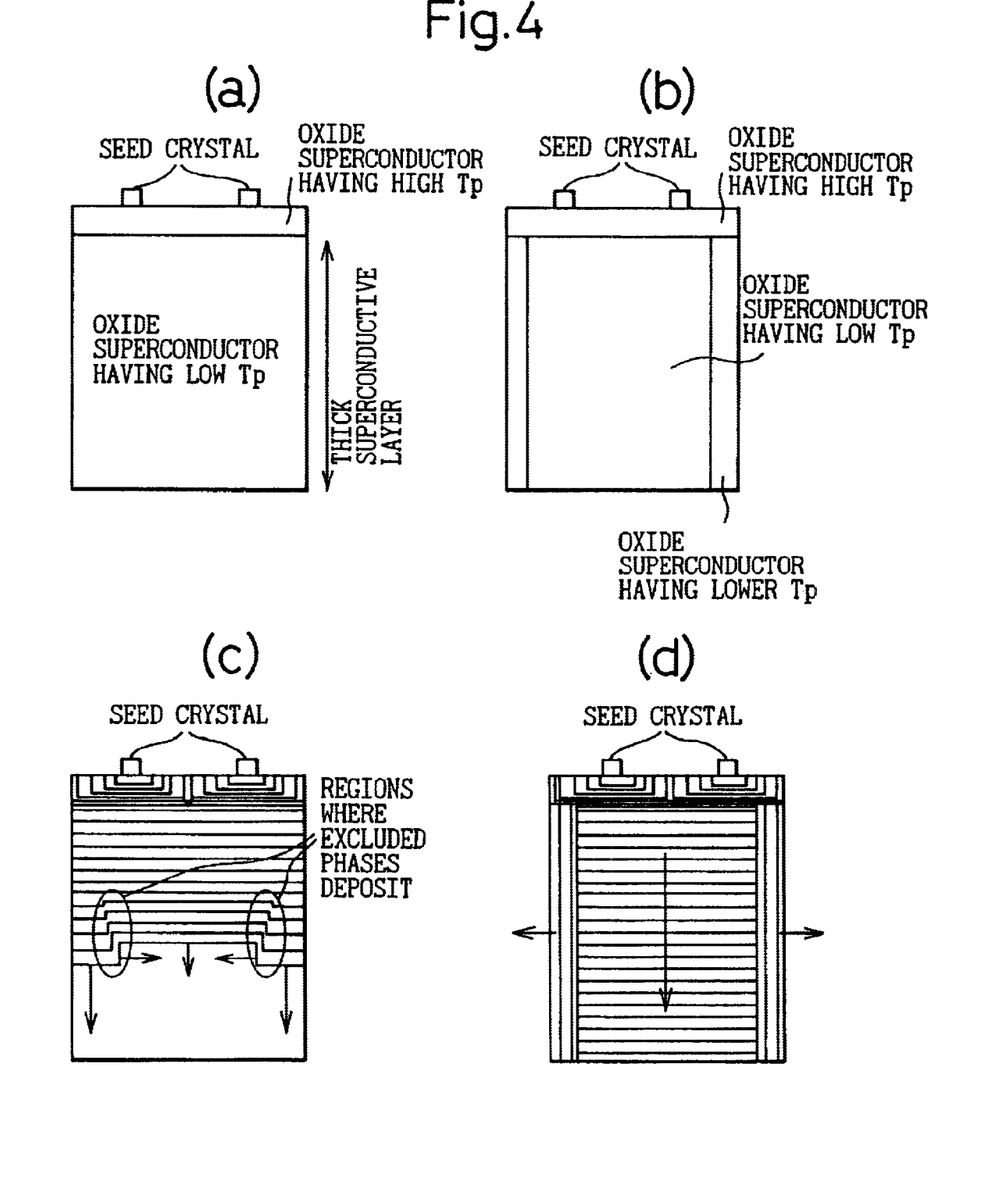
FIG. 4 is a diagram showing an example of a case where a crystal growth is carried out using seed crystals. (a) is a schematic view showing a layout of oxide superconductors for growing crystals over a long distance, with thick layers of oxide superconductors that have a low Tp. (b) is a schematic view showing a preferable layout of oxide superconductors for growing crystals over a long distance, with thick layers of oxide superconductors that have a low Tp. (c) is a diagram showing a crystal growth of the case shown in (a); and (d) is a diagram showing a crystal growth of the case shown in (b).

Further, in the case of carrying out a crystal growth over a long distance by providing a thick layer of superconductors having a low Tp, it is preferable to lay out the superconductors as shown in (b) of FIG. 4 instead of the layout shown in (a) of FIG. 4. According to the layout shown in (a) of FIG. 4, at the time of the crystal growth of the superconductors having a low Tp, the external side of the superconductors takes in a large volume of oxygen that is necessary for the crystal growth. Therefore, the crystal growth may progress faster than the internal side of the superconductors. This difference becomes extreme particularly when the crystal growth is carried out over a long distance. As shown in (c) of FIG. 4, after the crystal growth has progressed at the external side of the superconductors, the crystal growth starts toward the inside (corresponding to arrow marks in lateral directions in (c) of FIG. 4). Therefore, this crystal growth, progressing from the external side toward the inside, crosses the direction of the crystal growth starting from the internal side of the superconductors with a delay. As a result, excluded phases of a Ba—Cu—O phase and a Cu—O phase, or a segregated $RE_2BaCuO_5$ phase or $RE_4Ba_2Cu_2O_{10}$ phase are deposited in this crossed region. This results in an inhomogeneous large superconductive bulk unit, with deteriorated characteristics. On the other hand, when the superconductors are laid out as shown in (b) of FIG. 4, the existence of superconductors having lower Tp's makes no difference in the crystal growth speed due a difference in the taking-in of oxygen. Therefore, first, the crystal growth of the internal side superconductors having a low Tp progresses steadily. Thereafter, the superconductors having lower Tp's start crystal growth toward the external side (reference (d) of FIG. 4). As explained above, when the superconductors having lower Tp's are laid out, it is possible to eliminate or reduce the deposition of excluded phases. When the superconductors having lower Tp's are laid out in a small width, excluded phases are not deposited in the superconductors having lower Tp's. As a result, it is possible to obtain a large superconductive bulk unit capable of making a large current to flow even when the crystal growth is carried out over a long distance in a thick layer of superconductors. After finishing the crystal growth, the superconductors having lower Tp's may be disconnected.

The thickness of each superconductor will be explained next. When the crystal growth is carried out at a high temperature, a dispersion of superconductors having different Tp's occurs. Therefore, there arise regions of the same Tp in a part of the dispersed regions. Thus, regarding a lower limit of the thickness, it is preferable to have a thickness in which the superconductors having different Tp's can remain as a superconductor layer. For example, when the Tp has been changed by changing the RE, it is preferable that a lower limit of the thickness of each superconductor is about 100 μm. Further, it is preferable to set a ratio of thicknesses of the layers of superconductors such that the thickness of the layer of the superconductors that are to be disconnected does not exceed the thickness of the layer of the superconductors that remain after the disconnection, in consideration of the disconnection of the regions in which excluded phases have occurred, as described in claim 4 or 8 of the present invention.

Next, the setting of a deviation of the crystal orientation between closest seed crystals to within 30 degrees will be explained. It has been known that, in the superconductor of the $REBa_2Cu_3O_x$ system, a current that flows through the superconductor decreases in adjacent regions in which crystal orientations are mutually deviated. According to the superconductor of the $REBa_2Cu_3O_x$ manufactured by the conventional method 1, the superconductor may include regions in which the crystal orientations are deviated by about 30 degrees as a maximum In order to set an orientation to a level about the same as that of the superconductor manufactured by the conventional method 1, it is necessary that the deviation of the crystal orientations between seed crystals is set to within 30 degrees, and that the deviation of the crystal orientations in the oxide superconductor after the crystal growth is within about 30 degrees.

The addition of Rh, Pt and Ce will be explained next. These elements have the effect that a $RE_2BaCuO_5$ phase or a $RE_4Ba_2Cu_2O_{10}$ phase is finely dispersed in the base phases of the $REBa_2Cu_3O_x$ phases (123 phases), thereby improving the transition current density as one of the superconductive characteristics. The volume of addition is limited to within a range of density from a density at which the effect of fining of the $RE_2BaCuO_5$ phase or the $RE_4Ba_2Cu_2O_{10}$ phase comes out to a density at which there is no more effect by the addition. Based on this arrangement, it becomes possible to make a current of a larger current density flow within the superconductor. In other words, it is possible to obtain the effect of addition when Rh is in 0.001 to 2.0 mass % range, Pt is in 0.05 to 5.0 mass % range, and Ce is in 0.05 to 10.0 mass % range, respectively.

As seed crystals, it is possible to use a $NdBa_2Cu_3O_x$ system crystal, or a $(Sm,Nd)Ba_2Cu_3O_x$ system crystal, a crystal having a $K_2NiF_4$ crystal structure like $Sm_2CuO_4$ and $Nd_{2-x}Sr_xCu_{4-0.5x}$ ($0 \leq x \leq 2$), a crystal having a $Sr_3Ti_2O_7$ crystal structure like $Nd_xSr_{3-x}Cu_2O_{6+0.5x}$ ($0 \leq x \leq 3$), and a MgO crystal. It is also possible to use one kind or a combination of these seed crystals.

EXAMPLE 1

Raw material powders of $Dy_2O_3$, $BaO_2$, and CuO are mixed at a molar ratio of the elements (Dy:Ba:Cu) of (13:17:24). Further, Pt at 0.5 mass % is added to this mixed powder, to produce a mixed raw material powder. This mixed raw material powder is provisionally sintered in the oxygen atmosphere at 900° C. This will be called a powder 1-A. Further, $Y_2O_3$ is used in place of the $Dy_2O_3$ out of the raw material powder used for producing the powder 1-A, and a raw material powder is produced in a similar manner. This will be called a powder 1-B.

Figure 5:
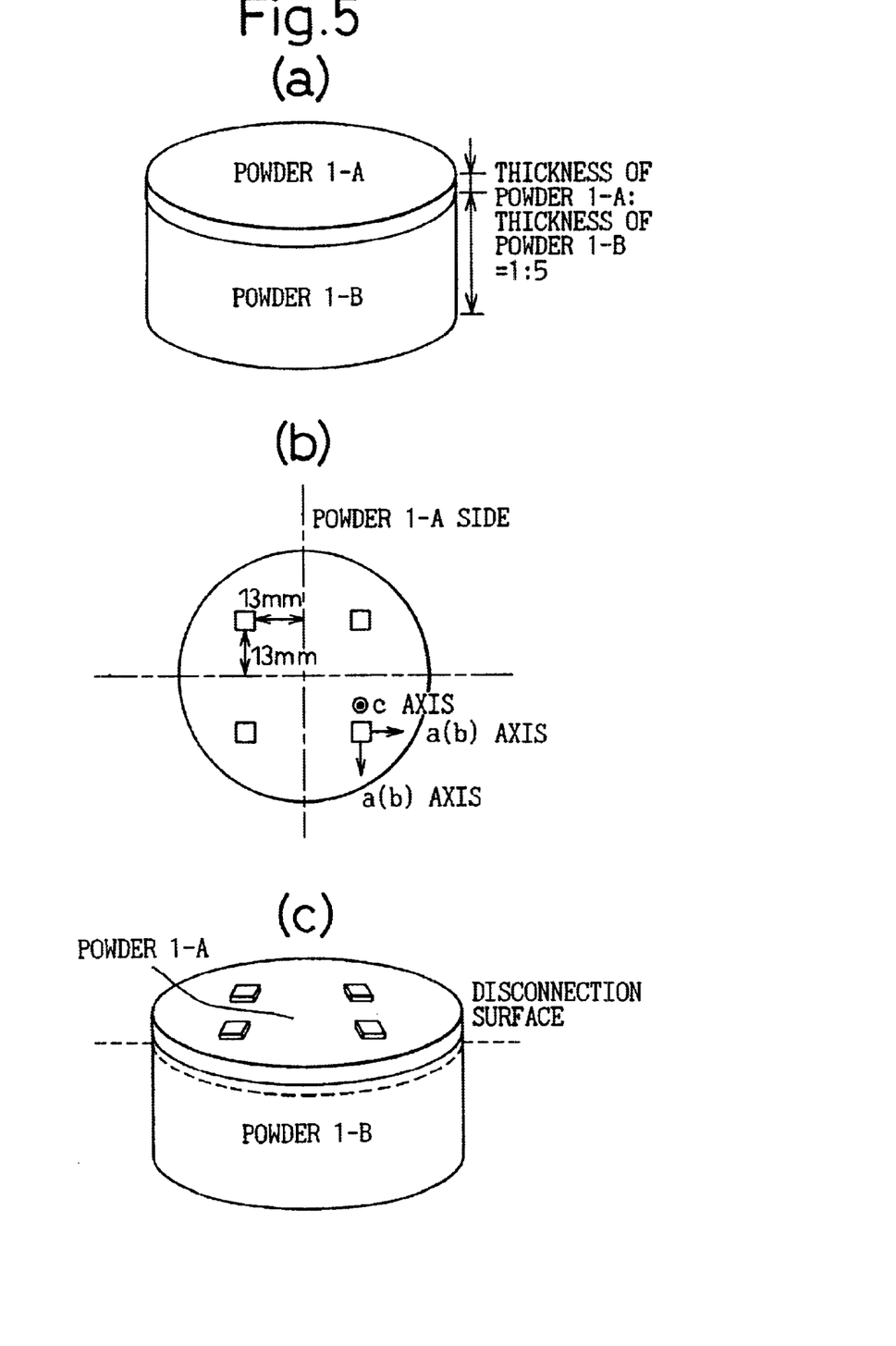
FIG. 5 is a schematic view of a superconductor used in Example 1. (a) is a schematic view of a mold; (b) is a layout diagram of seed crystals, and (c) is a schematic view of a position of disconnecting an oxide superconductive bulk material.

Next, a mold is produced using the powders 1-A and 1-B, thereby to prepare a cylindrical precursor of 2 ton/cm², a diameter 54 mm, and a thickness 40 mm, as shown in (a) of FIG. 5. On this precursor, there are laid out 3 mm×3 mm square and 1 mm thick superconductor seed crystals of $Sm_{0.2}Nd_{0.3}Ba_2Cu_3O_x$ system, as shown in (b) of FIG. 5. The precursor with the superconductor seed crystals is heated up to 1,045° C. in 10 hours. Then, the precursor is held for 4 hours, and the temperature of the precursor is lowered to 1,10° C. in 2 hours. Thereafter, the precursor is slowly cooled to 980° C. over 100 hours, to grow crystals. Then, the temperature of the sample is dropped to room temperature over 24 hours.

The precursor is disconnected to check the obtained superconductive bulk material as shown in (c) of FIG. 5. As a result, no excluded phases like Ba—Cu—O were observed at the powder 1-B side. Further, the material is cut to obtain a bulk having a thickness 20 mm. This bulk is heated to 450° C. in the oxygen atmosphere over 24 hours. The bulk is cooled slowly to 300° C. over 100 hours. Then, the temperature of the sample is dropped to room temperature over 10 hours.

The superconductive bulk material obtained by the above-described oxygen enrichment processing is cooled in the magnetic field at 77 K, and then the external magnetic field is removed. Thereafter, the trapped magnetic flux density is measured. As a result, a satisfactory value of a maximum 0.9 T is obtained.

EXAMPLE 2

Raw material powders of $Sm_2O_3$, $BaO_2$, and CuO are mixed at a molar ratio of the elements (Sm:Ba:Cu) of (12:18:26). Further, Pt at 0.5 mass % is added to this mixed powder, to produce a mixed raw material powder. This mixed raw material powder is provisionally sintered in the oxygen atmosphere at 900° C. This will be called a powder 2-A. Further, raw material powders of $Sm_2O_3$, $BaO_2$, and CuO are mixed at a molar ratio of the elements (Sm:Ba:Cu) of (12:18:26). Further, Ce at 1.0 mass % and Ag at 20 mass % are added to this mixed powder, to produce a mixed raw material powder. This mixed raw material powder is provisionally sintered in the oxygen atmosphere at 900° C. This will be called a powder 2-B.

Figure 6:
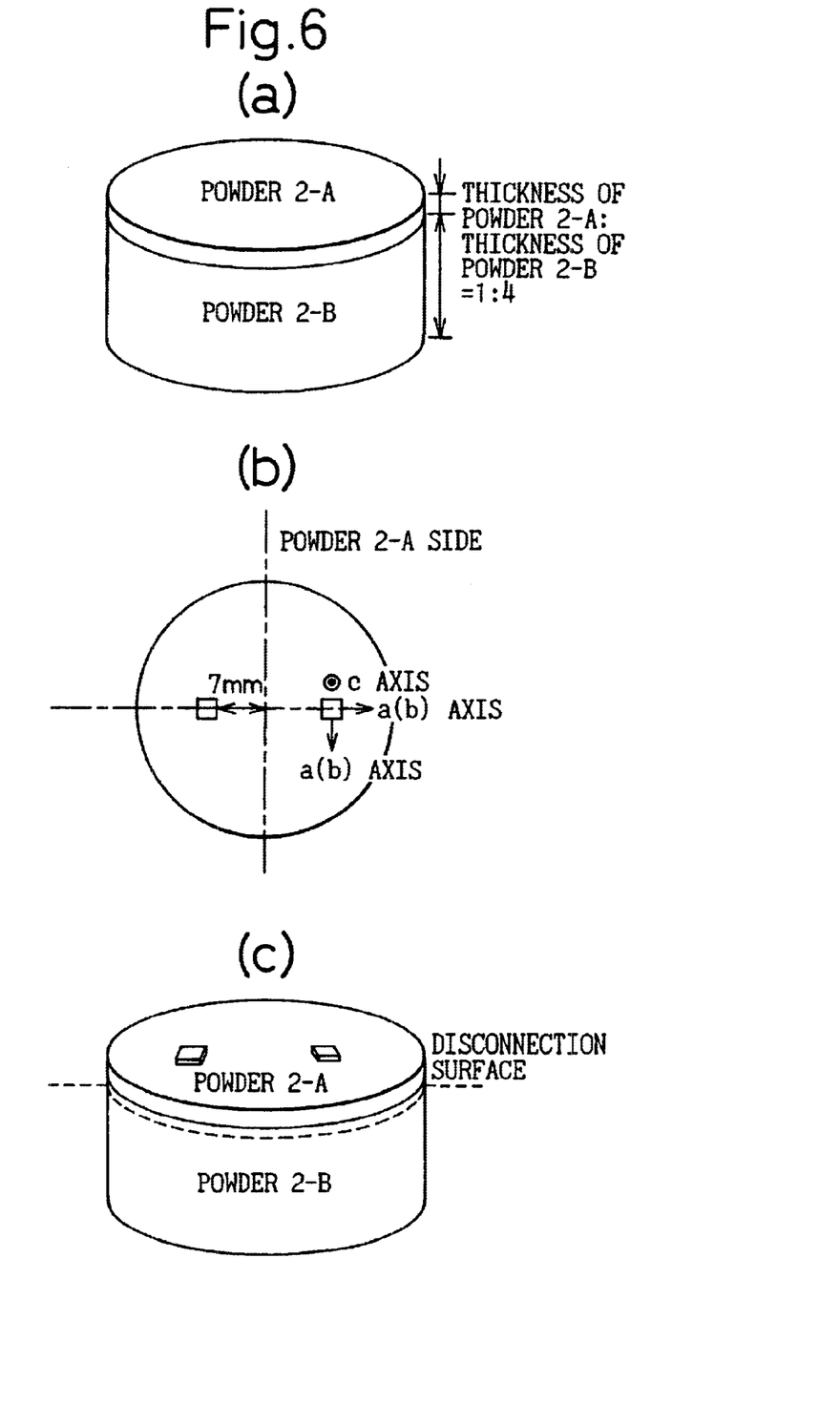
FIG. 6 is a schematic view of a superconductor used in Example 2. (a) is a schematic view of a mold; (b) is a layout diagram of seed crystals; and (c) is a schematic view of a position of disconnecting an oxide superconductive bulk material.

Next, a mold is produced using the powders 2-A and 2-B, thereby to prepare a cylindrical precursor at 2 ton/cm² with a diameter 36 mm and a thickness 30 mm, as shown in (a) of FIG. 6. This precursor is heated up to 1,100° C. in 10 hours in the atmosphere of 99% nitrogen partial pressure and 1% oxygen partial pressure. The precursor is held for 30 minutes, and the temperature of the precursor dropped to 1,025° C. in 2 hours. Thereafter, on this precursor, there are laid out 2 mm×2 mm square and 1.5 mm thick superconductor seed crystals of $NdBa_2Cu_3O_x$ system, as shown in (b) of FIG. 6. Thereafter, they are slowly cooled to 990° C. over 50 hours, to grow crystals. Then, the temperature of the sample is dropped to room temperature over 24 hours.

The precursor is disconnected to check the obtained superconductive bulk material as shown in (c) of FIG. 5. As a result, there are observed no excluded phases like Ba—Cu—O at the powder 2-B side. Further, the material is cut to obtain a bulk having a thickness 20 mm. This bulk is heated to 400° C. in the oxygen atmosphere over 24 hours. The bulk is cooled slowly to 300° C. over 100 hours. Then, the temperature of the sample is dropped to room temperature over 10 hours.

The superconductive bulk material obtained by the above-described oxygen enrichment processing is cooled in the magnetic field at 77 K, and then the external magnetic field is removed. Thereafter, the trapped magnetic flux density is measured. As a result, a satisfactory value of a maximum 0.6 T is obtained.

EXAMPLE 3

Raw material powders of $Y_2O_3$, $Dy_2O_3$, and CuO are mixed at a molar ratio of the elements (Y:Dy:Ba:Cu) of (6.5:6.5:17:24). Further, Ph at 0.2 mass % is added to this mixed powder, to produce a mixed raw material powder. This mixed raw material powder is provisionally sintered in the oxygen atmosphere at 900° C. This will be called a powder 3-A. Further, raw material powders of $Y_2O_3$, $BaO_2$, and CuO are mixed at a molar ratio of the elements (Y:Ba:Cu) of (12.5:17.5:24.5). Further, Ph at 0.2 mass % is added to this mixed powder, to produce a mixed raw material powder. This mixed raw material powder is provisionally sintered in the oxygen atmosphere at 900° C. This will be called a powder 3-B.

Figure 7:
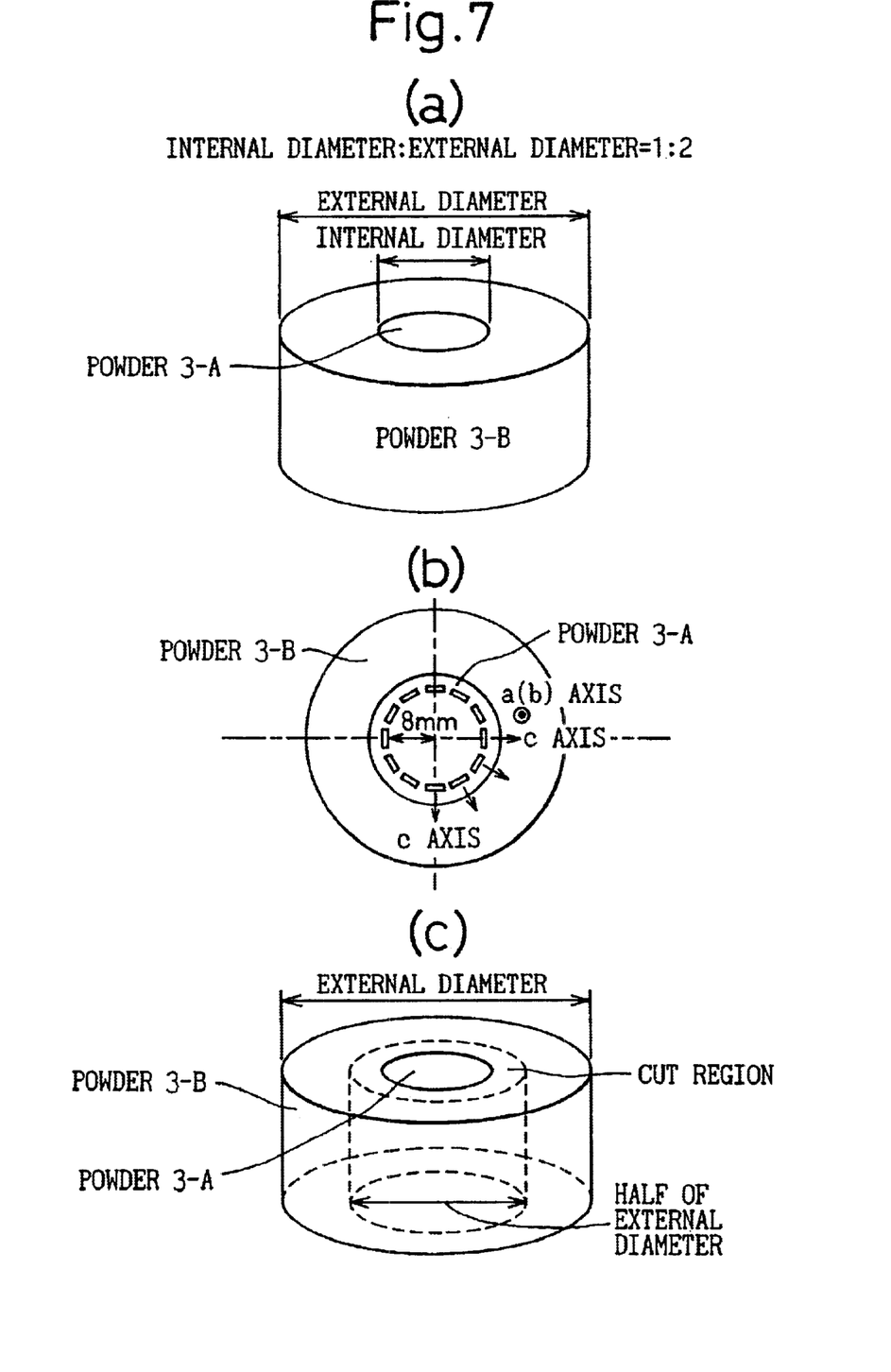
FIG. 7 is a schematic view of a superconductor used in Example 3. (a) is a schematic view of a mold used for a comparative example in Example 3; (b) is a layout diagram of seed crystals; and (c) is a schematic view of a position of disconnecting an oxide superconductive bulk material.

Next, a mold is produced using the powders 3-A and 3-B, thereby to prepare a cylindrical precursor of 2 ton/cm$^2$, with a diameter 54 mm and a thickness 40 mm, as shown in (a) of FIG. 7. Further, for the sake of comparison, a cylindrical precursor with a diameter 54 mm and a thickness 40 mm is prepared using only the powder 3-B. Thereafter, on each of these precursors, there are laid out 12 "superconductor seed crystals about 2 mm×2 mm square and 1.5 mm thick" of the NdBa$_2$Cu$_3$O$_x$ system, as shown in (b) of FIG. 7. Thereafter, they are heated up to 1,050° C. in the atmosphere in 10 hours, and are held for 4 hours. The temperature of each precursor dropped to 1,010° C. in 2 hours. Thereafter, they are slowly cooled to 980° C. over 200 hours, to grow crystals. Then, the temperature of each precursor dropped to a room temperature over 24 hours.

In order to check the obtained superconductive bulk material, each sample is cut as shown in (c) of FIG. 7 to obtain a bulk having a thickness 20 mm. Each bulk is heated to 450° C. in the oxygen atmosphere over 24 hours. Each bulk is cooled slowly to 250° C. over 100 hours. Then, the temperature of the sample dropped to a room temperature over 10 hours.

Figure 8:
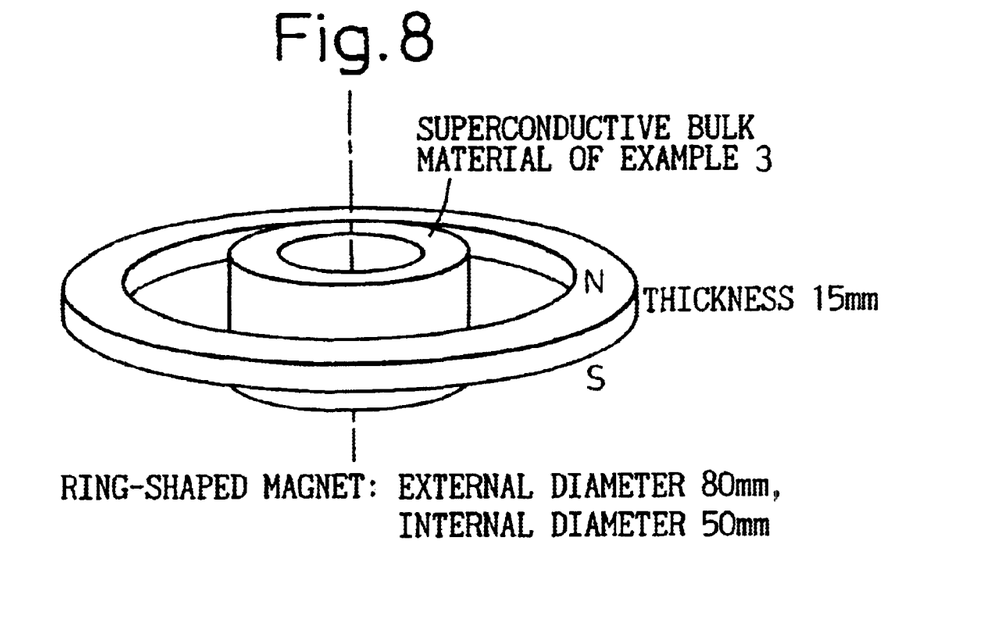
FIG. 8 is a diagram showing a shape of a ring-shaped magnet used in Example 3, and a layout of the magnet relating to a measurement of suction.

The superconductive bulk material obtained by the above-described oxygen enrichment processing is cooled in the magnetic field at 77 K using a Nd—Fe—B system magnet in the layout as shown in FIG. 8. Attractive force is checked based on a displacement of the Nd—Fe—B system magnet on the axis. As a result, the sample prepared using the powder 3-A has a maximum attractive force that is three times larger than that of the sample prepared using only the powder 3-B.

EXAMPLE 4

Raw material powders of Y$_2$O$_3$, Dy$_2$O$_3$, and CuO are mixed at a molar ratio of the elements (Y:Dy:Ba:Cu), of (6.5:6.5:17:24). Further, the Pt element at 0.5 mass % is added to this mixed powder, to produce a mixed raw material powder. This mixed raw material powder is provisionally sintered in the oxygen atmosphere at 870° C. This will be called a powder 4-A.

Figure 9:
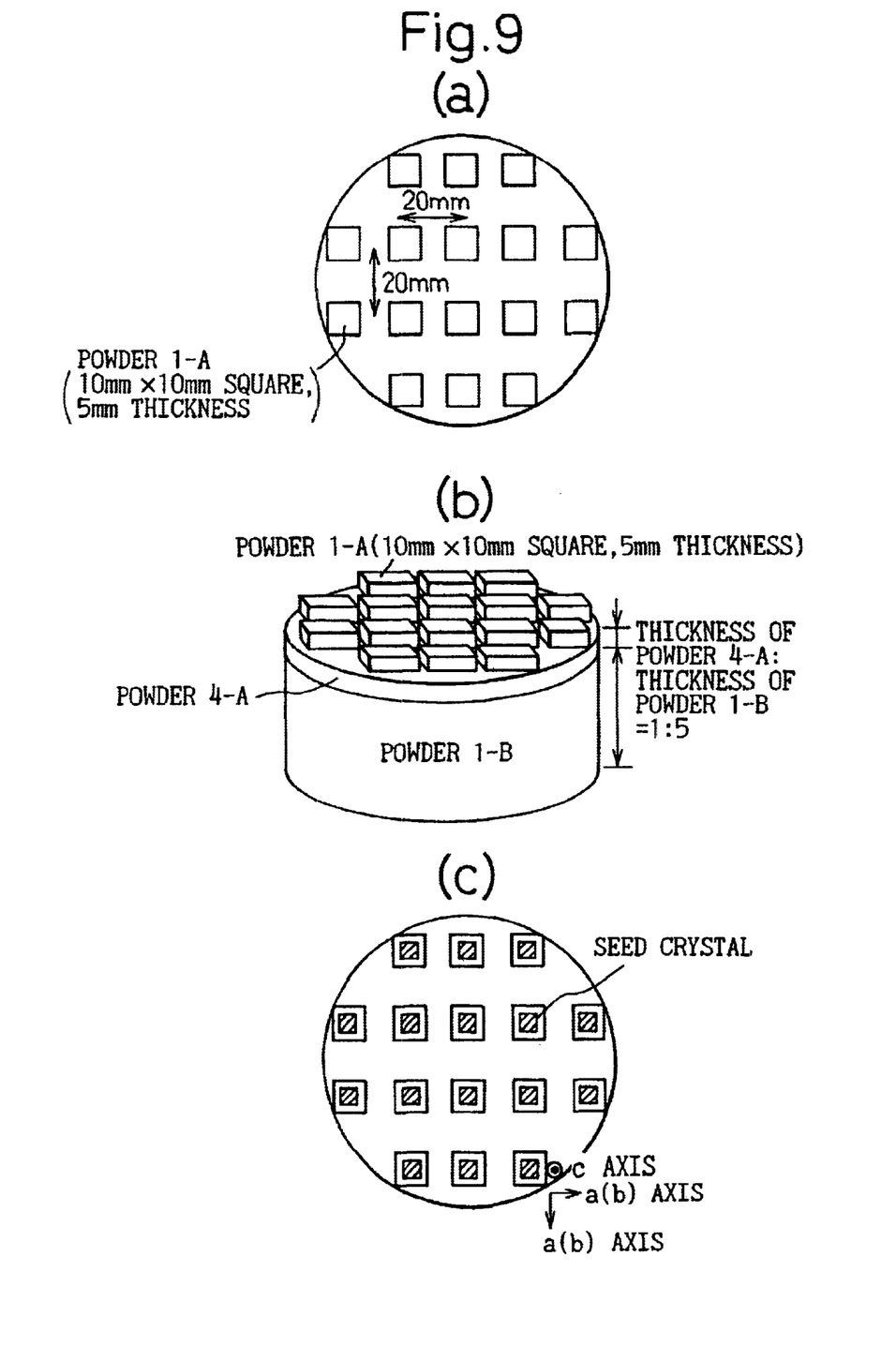
FIG. 9 is a schematic view of a superconductor used in Example 4. (a) is a top plan view as viewed from powder 1-A side of a mold P. (b) is a perspective view of the mold P. (c) is a layout schematic view of seed crystals of the mold P (a top plan view from the powder 1-A side).
Figure 10:
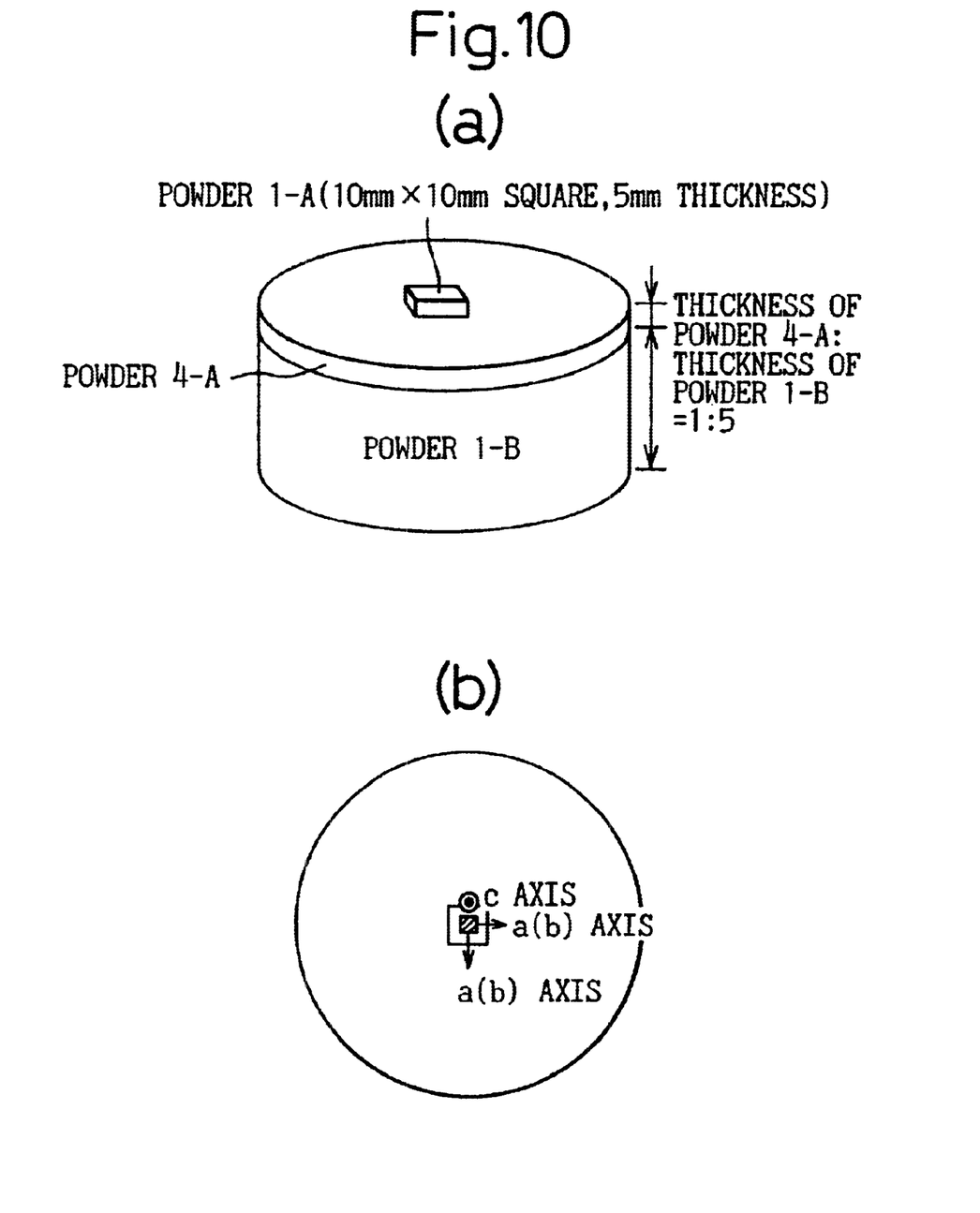
FIG. 10 is a schematic view of a mold used for a comparative example in Example 4. (a) is a perspective view of a mold Q; and (b) is a layout schematic view of seed crystals of the mold Q (a top plan view from the powder 1-A side).

A mold is produced using the powders 1-A and 1-B used in Example 1 and the above powder 4-A, thereby to prepare a cylindrical precursor P at 2 ton/cm$^2$, with a diameter 115 mm, and a thickness 50 mm, as shown in (a) and (b) of FIG. 9. Further, for the sake of comparison, a mold as shown in (a) of FIG. 10 is produced, and a cylindrical precursor Q at 2 ton/cm, with a diameter 115 mm and a thickness 50 mm is prepared.

As shown in (c) of FIG. 9, in the case of the precursor P, there are laid out 16 "2 mm×2 mm square and 1.5 mm thick superconductor seed crystals" of the NdBa$_2$Cu$_3$O$_x$ system, each one seed crystal disposed on each 1-A precursor layer at a position near the center. Further, as shown in (b) of FIG. 10, the precursor Q has one seed crystal disposed at a position near the center. Each sample is heated up to 1,050° C. in the atmosphere in 10 hours, and is held for 4 hours. The temperature of each precursor dropped to 1,010° C. in 2 hours. Thereafter, each sample is slowly cooled to 980° C. over 100 hours, to grow crystals. Then, the temperature of the was sample was dropped to room temperature over 24 hours.

Of the superconductive bulk materials obtained, the sample P that uses the 16 seed crystals has a crystal growth on almost the whole surface of the bulk material. On the other hand, the sample Q that uses the one seed crystal does not have sufficient crystal growth, with the crystal growth only obtained in a 43 mm×43 mm square region.

EXAMPLE 5

Raw material powders of Gd$_2$O$_3$, Dy$_2$O$_3$, and CuO are mixed at a molar ratio of the elements (Gd:Dy:Ba:Cu) of (3:10:17:24). Further, Pt at 0.5 mass % is added to this mixed powder, to produce a mixed raw material powder. This mixed raw material powder is provisionally sintered in the oxygen atmosphere at 900° C. This will be called a powder 5-A.

Figure 11:
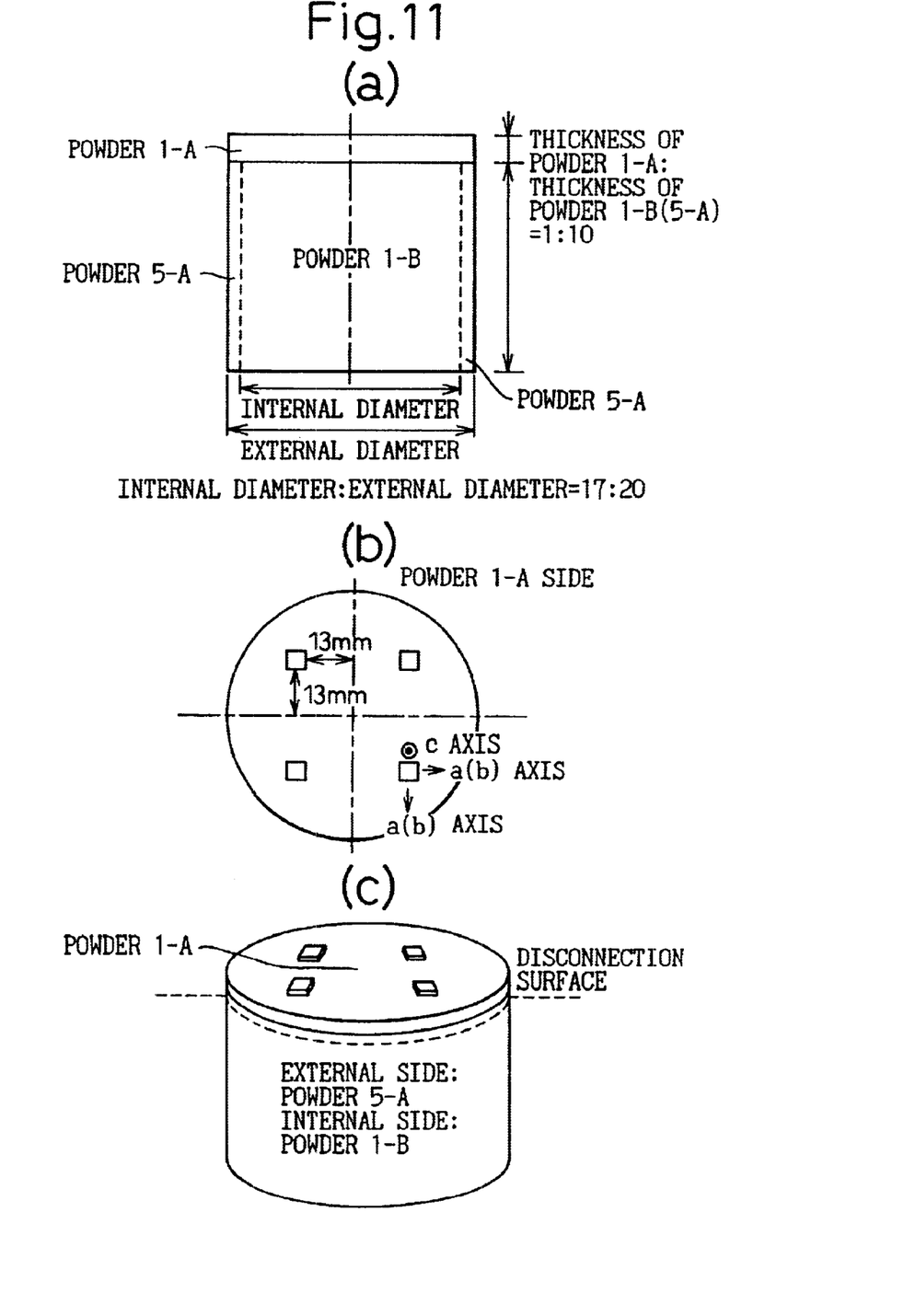
FIG. 11 is a schematic view of a superconductor used in Example 5. (a) is a cross-sectional view of a mold. (b) is a layout diagram of seed crystals (a top plan view from the powder 1-A side). (c) is a schematic view of a position of disconnecting an oxide superconductive bulk material.

A mold is produced using the powders 1-A and 1-B used in Example 1 and the above powder 5-A, thereby to prepare a cylindrical precursor at 2 ton/cm$^2$, with a diameter 54 mm, and a thickness 40 mm, as shown in (a) of FIG. 11. On this precursor, there are laid out 3 mm×3 mm square and 1 mm thick superconductor seed crystals of Sm$_{0.7}$Nd$_{0.3}$Ba$_2$Cu$_3$O$_x$ system, as shown in (b) of FIG. 11. This precursor is heated up to 1,050° C. in the atmosphere in 10 hours, and is held for 4 hours. The temperature of the precursor dropped to 1,030° C. in 2 hours. Thereafter, the precursor is slowly cooled to 980° C. over 100 hours, to grow crystals. Then, the temperature of the sample is dropped to room temperature over 24 hours.

The precursor is disconnected to check the obtained superconductive bulk material as shown in (c) of FIG. 11. As a result, there are observed no excluded phases like Ba—Cu—O at the powder 1-B side. Further, the material is cut to obtain a bulk having a thickness 20 mm. This bulk is heated to 450° C. in the oxygen atmosphere over 24 hours. The bulk is cooled slowly to 300° C. over 100 hours. Then, the temperature of the sample is dropped to room temperature over 10 hours.

The superconductive bulk material obtained by the above-described oxygen enrichment processing is cooled in the magnetic field at 77 K, and then the external magnetic field is removed. Thereafter, the trapped magnetic flux density is measured. As a result, a satisfactory value of a maximum 1.1 T is obtained.

EXAMPLE 6

Figure 12:
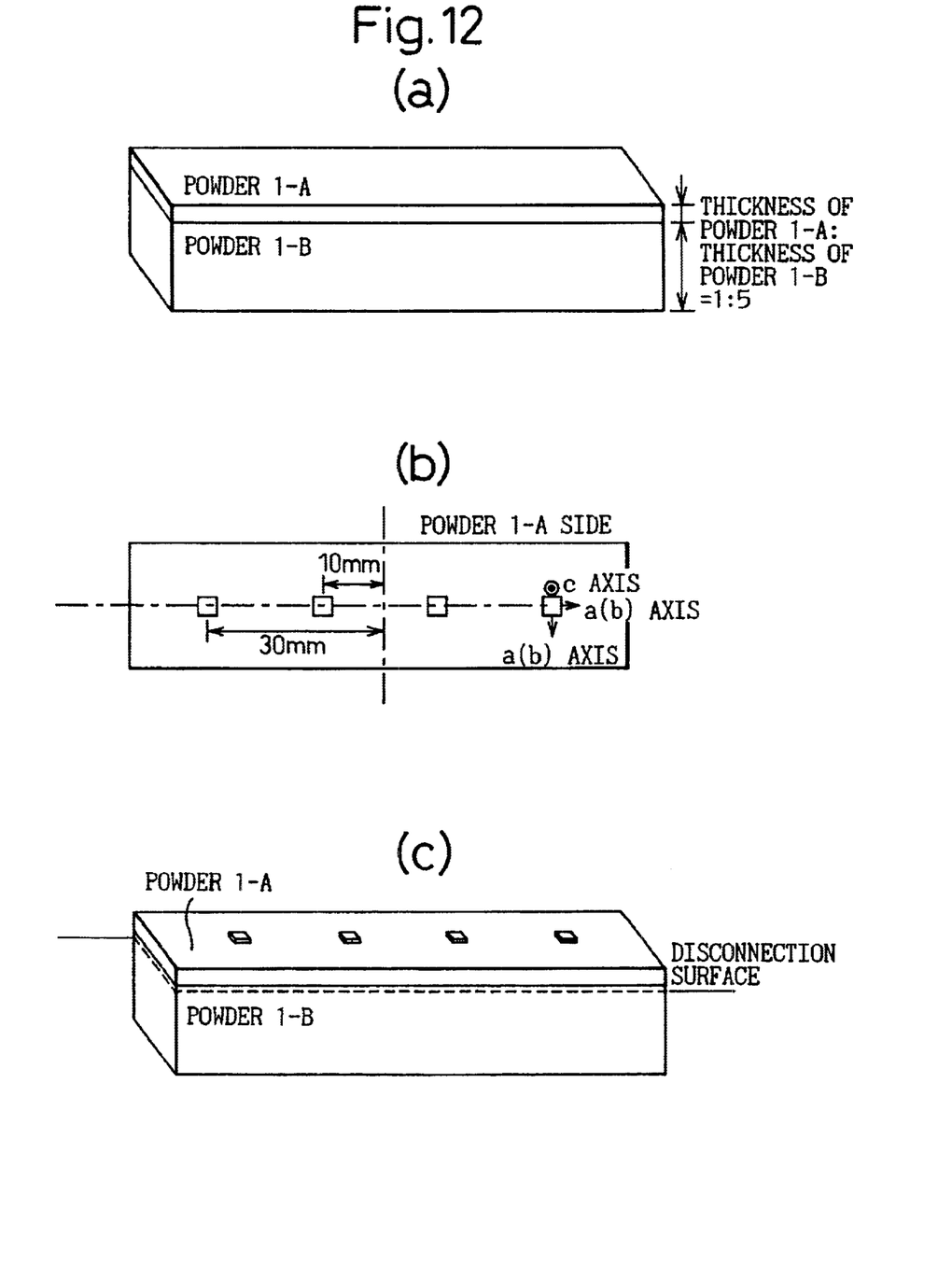
FIG. 12 is a schematic view of a superconductor used in Example 6. (a) is a schematic view (a perspective view) of a mold. (b) is a layout diagram of seed crystals (a top plan view from the powder 1-A side). (c) is a schematic view of a position of disconnecting an oxide superconductive bulk material.

A mold is produced using the powders 1-A and 1-B used in Example 1 and the above powder 5-A, thereby to prepare a bar-shaped precursor at 2 ton/cm$^2$, with a length of 80 mm, a width of 20 mm, and a thickness of 20 mm, as shown in (a) of FIG. 12. On this precursor, there are laid out 3 mm×3 mm square and 1 mm thick superconductor seed crystals of the Sm$_{0.7}$Nd$_{0.3}$Ba$_2$Cu$_3$O$_x$ system, as shown in (b) of FIG. 12. This precursor is heated up to 1,050° C. in the atmosphere in 10 hours, and is held for 4 hours. The temperature of the precursor dropped to 1,030° C. in 2 hours. Thereafter, the precursor is slowly cooled to 980° C. over 100 hours, to grow crystals. Then, the temperature of the sample is dropped to room temperature over 24 hours.

The precursor is disconnected to check the obtained superconductive bulk material as shown in (c) of FIG. 12. As a result, there were observed no excluded phases, like Ba—Cu—O, at the powder 1-B side. Further, the material is cut to obtain a bulk having a thickness 8 mm. Then, silver is deposited on the whole surface by sputtering. This bulk is heated to 450° C. in the oxygen atmosphere over 24 hours. The bulk is cooled slowly to 300° C. over 100 hours. Then, the temperature of the sample is dropped to room temperature over 10 hours.

The superconductive bulk material obtained by the above-described oxygen enrichment processing is tested by conducting a DC current to this material at 77 K. As a result, it is possible to conduct the current up to 100 A with no occurrence of resistance.

According to the present invention, there is an effect that it is possible to pass a large current through the superconductive bulk material, and that it is possible to realize a crystal growth on a large bulk material in a short period of time.

What is claimed is:

1. A large superconductor intermediate of $REBa_2Cu_3O_x$ system (where RE is one kind or a combination of rare earth elements including Y), characterized by a structure that oxide superconductors having non-superconductive phases finely dispersed in $REBa_2Cu_3O_x$ phases (123 phases) of different peritectic temperatures (Tp) are laminated three-dimensionally in the order of Tp's, seed crystals mounted on the oxide superconductor layer having a highest Tp, and excluded phases included in at least the oxide superconductor having the high Tp.

2. The large superconductor intermediate according to claim 1, wherein a deviation of a crystal orientation between the nearest seed crystals is within 30 degrees in the mounting of seed crystals.

3. The large superconductor intermediate according to claim 1, wherein the 4' laminated structure includes at least one oxide superconductor that includes at least one of Rh of 0.001 to 2.0 mass %, Pt of 0.05 to 5.0 mass %, and Ce of 0.05 to 10.0 mass %.

4. A method for manufacturing a large superconductor intermediate, comprising the steps of heating raw material molds including RE, Ba and Cu that constitute a superconductor of the $REBa_2Cu_3O_x$ system (one kind or a combination of rare earth elements including Y), heating the molds to a level equal to or above a peritectic temperature (Tp) of $REBa_2Cu_3O_x$ phases (123 phases) of the molds as a maximum temperature, and cooling the molds to manufacture an oxide superconductor intermediate having non-superconductive phases finely dispersed in the 123 phases, characterized by laminating three-dimensionally the raw material molds of 123 phases having different Tp's in the order of Tp's to form a raw material mold laminate, mounting seed crystals on the raw material mold having a highest Tp, and generating a crystal growth of the raw material mold laminate.

5. The method for manufacturing a large superconductor intermediate according to claim 4, wherein a deviation of a crystal orientation between the nearest seed crystals is within 30 degrees in the mounting of seed crystals.

6. The method for manufacturing a large superconductor intermediate according to claim 5, wherein the raw material mold laminate includes at least one raw material mold that includes at least one of Rh of 0.001 to 2.0 mass %, Pt of 0.05 to 5.0 mass %, and Ce of 0.05 to 10.0 mass %.

7. A large superconductor of $REBa_2Cu_3O_x$ system (where RE is one kind or a combination of rare earth elements including Y), characterized by carrying out:

a removal of an oxide superconductor that includes seed crystals or excluded phases on the large superconductor intermediate in claim 1.

8. A large superconductor of $REBa_2Cu_3O_x$ system (where RE is one kind or a combination of rare earth elements including Y), characterized by carrying out:

a removal of an oxide superconductor that includes seed crystals or excluded phases, and an oxygen enrichment heat treatment on the large superconductor intermediate in claim 1.

9. A large superconductor of $REBa_2Cu_3O_x$ system where RE is one kind or a combination of rare earth elements including Y), characterized by carrying out:

an oxygen enrichment heat treatment on the large superconductor intermediate in claim 1.

10. A method for manufacturing a large superconductor of the $REBa_2Cu_3O_x$ system (where RE is one kind or a combination of rare earth elements including Y) system, comprising the steps of:

carrying out a removal of an oxide superconductor that includes seed crystals or excluded phases from the large superconductor intermediate manufactured by the method in claim 4.

11. A method for manufacturing a large superconductor of the $REBa_2Cu_3O_x$ system (where RE is one kind or a combination of rare earth elements including Y) system, comprising the steps of:

carrying out a removal of an oxide superconductor that includes seed crystals or excluded phases from the large superconductor intermediate manufactured by the method in claim 4, and carrying out an oxygen enrichment heat treatment on this intermediate.

12. A method for manufacturing a large superconductor of the $REBa_2Cu_2O_x$ system (where RE is one kind or combination of rare earth elements including Y) system, comprising the steps of:

carrying out an oxygen enrichment heat treatment on the large superconductor intermediate manufactured by the method in claim 4.

* * * * *